(12) United States Patent
Chen

(10) Patent No.: US 7,042,745 B1
(45) Date of Patent: May 9, 2006

(54) INSULATING ARRANGEMENT FOR DC/AC INVERTER

(75) Inventor: Wei-Kuang Chen, Pa Teh (TW)

(73) Assignee: Cotek Electronic Ind. Co. Ltd., Pa Teh (TW)

( * ) Notice: Subject to any disclaimer, the term of this patent is extended or adjusted under 35 U.S.C. 154(b) by 0 days.

(21) Appl. No.: 11/000,110

(22) Filed: Nov. 29, 2004

(51) Int. Cl.
*H02M 1/00* (2006.01)
*H05K 1/00* (2006.01)

(52) U.S. Cl. ....................... 363/144; 361/818
(58) Field of Classification Search ............... 363/39, 363/40, 131, 144; 361/715, 816, 818; 174/35 R
See application file for complete search history.

(56) References Cited

U.S. PATENT DOCUMENTS

| | | | | |
|---|---|---|---|---|
| 5,091,823 A | * | 2/1992 | Kanbara et al. | 361/697 |
| 5,956,246 A | * | 9/1999 | Sequeira et al. | 363/144 |
| 6,219,245 B1 | * | 4/2001 | Nagashima et al. | 361/705 |
| 6,373,705 B1 | * | 4/2002 | Koelle et al. | 361/720 |
| 6,377,479 B1 | * | 4/2002 | Ayano et al. | 363/40 |
| 6,636,429 B1 | * | 10/2003 | Maly et al. | 361/818 |
| 6,654,261 B1 | * | 11/2003 | Welches et al. | 363/41 |
| 6,664,464 B1 | * | 12/2003 | Liao et al. | 174/35 GC |

* cited by examiner

*Primary Examiner*—Adolf Berhane

(57) ABSTRACT

A DC-to-AC inverter includes an inverter housing, a power conversion module, and an interference insulating arrangement which includes a DC inlet and an insulating member. The inverter housing has a receiving compartment defining an interference zone within which electromagnetic interference occurs, and a free zone free of electromagnetic interference. The power conversion module includes a main PCB which has a DC-AC inversion circuitry implemented thereon to convert an input DC signal into an output AC signal. The DC inlet is electrically connected to the main PCB for connecting with a DC power source to draw of a DC current as the input DC signal to the main PCB, wherein the CD inlet is located at the free zone of the receiving compartment to insulate the DC inlet from being electromagnetically interfered during a DC to AC conversion at the power conversion module.

20 Claims, 2 Drawing Sheets

INSULATING ARRANGEMENT FOR DC/AC INVERTER

BACKGROUND OF THE PRESENT INVENTION

1. Field of Invention

The present invention relates to an inverter, and more particularly to a DC-AC inverter comprising an insulation arrangement which is capable of minimizing electromagnetic interference with the input current so as to ensure quality conversion of the relevant electrical signal, and to disperse the heat in the DC-AC inverter for preventing overheating of the DC-AC inverter.

2. Description of Related Arts

Conventional DC-AC power inverters are commonly utilized for a wide variety of purposes including uninterruptible power supplies (UPSs), motor devices, and many other suitable applications, especially in motor vehicles.

A conventional DC-AC inverter usually comprises an inverter case having a DC inlet and an AC outlet, an inverter circuitry disposed in the inverter case for converting DC from the DC inlet to AC which is transmitted out of the inverter case via the AC outlet. The inverter circuitry usually comprises a switching circuitry, a RMS voltage calculation module, a summing module, a voltage control module, a phase lock loop, a multiplier module, and a voltage mode control circuit.

As a matter of conventional art, the inverter circuitry is usually implemented in a precisely manufactured Printed Circuit Board (PCB) which is securely supported within the inverter case for electrically connecting between the DC inlet and the AC outlet. In relation to this arrangement, very often, the DC inlet and the AC outlet are spacedly apart from and opposite to each other so as to facilitate convenient applications of the DC-AC inverter in question.

There exists a major drawback however, among these conventional DC-AC inverters. As a matter of fact, for almost all conventional DC-AC inverters, the DC inlet is positioned to be as close to the DC power source, which is usually embodied as large-scale power electrical devices such as transformers. As such, the DC power source would generate a large amount of electromagnetic interference with other electronics, including the DC-AC inverter because of their close distance. As a result, the DC inlet, which is made of metallic materials such as copper, is subject to severe interference. As a result, the quality of conversion from DC to AC may be severely curtailed.

Moreover, the benefit of providing the DC input at a position close to the DC power source must be balanced against the temperature rise in the vicinity of the DC inlet, which may cause severe deterioration of the performance of the DC-AC inverter as a whole.

SUMMARY OF THE PRESENT INVENTION

A main object of the present invention is to provide a DC-AC inverter comprising an insulating arrangement which is capable of minimizing electromagnetic interference with the input and output current so as to ensure quality conversion of the relevant electrical signal.

Another object of the present invention is to provide a DC-AC inverter comprising an insulating arrangement which is adapted to act as a heat sink for extracting heat from the DC-AC inverter so as to facilitate quality performance thereof.

Another object of the present invention is to provide a DC-AC inverter with an insulating arrangement which may be manufactured by a wide variety of materials so as to maximize a range of applications of the present invention.

Another object of the present invention is to provide a DC-AC inverter comprising an insulating arrangement which can be easily assembled to and disassembled from the DC-AC inverter.

Another object of the present invention is to provide a DC-AC inverter incorporated with an insulating arrangement which does not involve complicated mechanical or electrical components so as to minimize manufacturing cost and the ultimate selling price of the present invention. In other words, the present invention is cost-effective in achieving a deep-seated problems encountered by conventional arts.

Accordingly, in order to accomplish the above objects, the present invention provides a DC-AC inverter, comprising:

an inverter housing having a receiving compartment and defining an interference zone that electromagnetic interference occurs therewithin and a free zone with free of electromagnetic interference;

a power conversion module comprising a main PCB (Print Circuit Board) which has a DC-AC inversion circuitry implemented thereon to convert an input DC signal into an output AC signal and is supported on a bottom wall of the inverter housing within the receiving compartment, wherein a portion of the main PCB is located at the interference zone of the inverter housing and a portion of the main PCB is located at the free zone of the inverter housing; and an interference insulating arrangement, comprising:

a DC inlet electrically connected to the main PCB for connecting with a DC power source to draw of a DC current as the input DC signal to the main PCB, wherein the CD inlet is located at the free zone of the receiving compartment to insulate the DC inlet from being electromagnetically interfered during a DC to AC conversion at the power conversion module; and an insulating member disposed between the bottom wall of the inverter housing and the main PCB to insulate the DC inlet with the bottom wall of the invert casing so as to further minimize the electromagnetic interference of the DC inlet with respect to the inverter housing.

These and other objectives, features, and advantages of the present invention will become apparent from the following detailed description, the accompanying drawings, and the appended claims.

DETAILED DESCRIPTION OF THE PREFERRED EMBODIMENT

Figure 1:
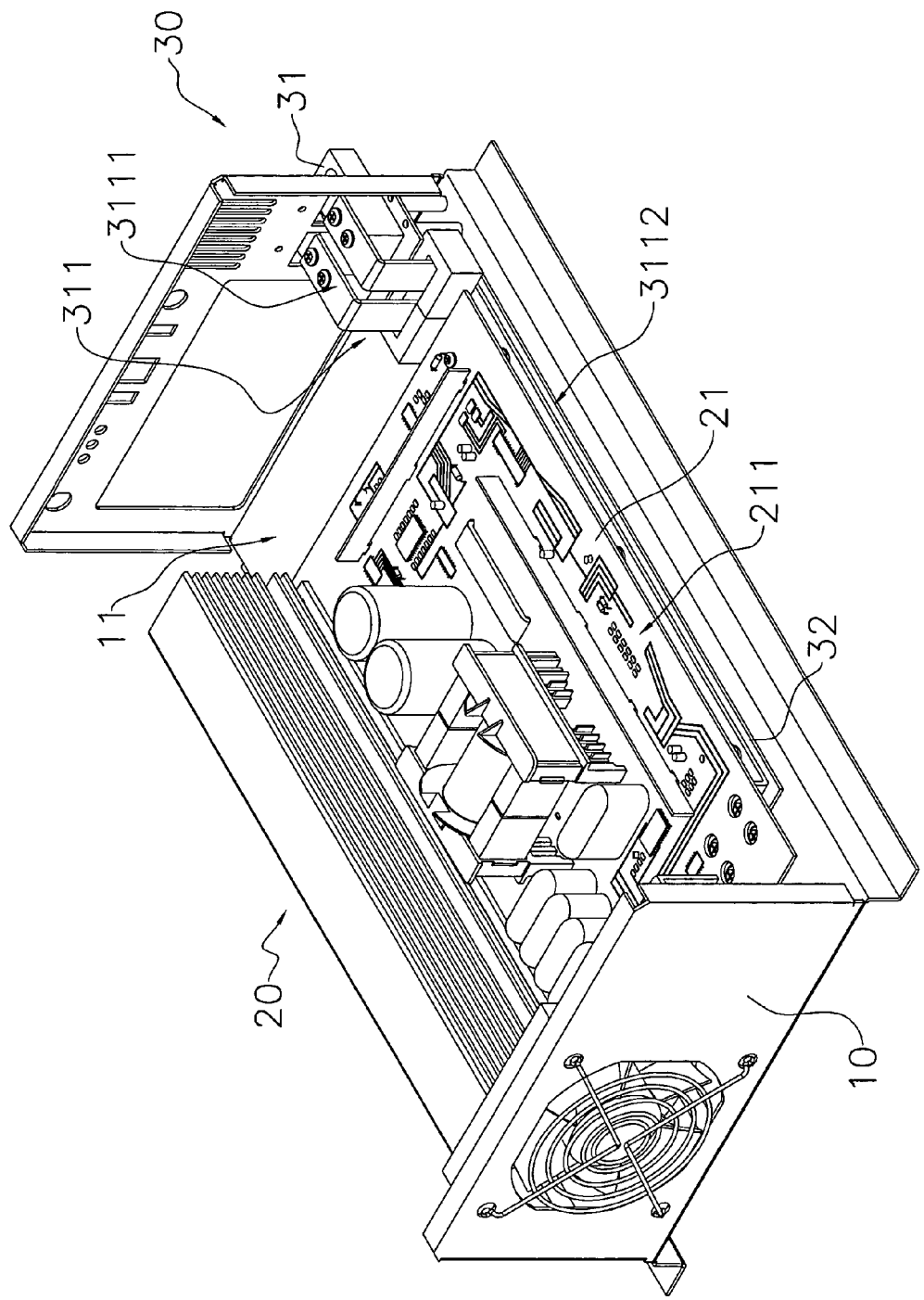
FIG. 1 is a perspective view of a DC-AC inverter according to a preferred embodiment of the present invention.

Referring to FIG. 1 of the drawings, a DC-AC inverter according to a preferred embodiment of the present invention is illustrated, in which the DC-AC inverter comprises an inverter housing 10, a power conversion module 20, and an interference insulating arrangement 30.

The inverter housing 10 has a receiving compartment 11 defining an interference zone within which electromagnetic interference occurs, and a free zone which is free of electromagnetic interference.

The power conversion module 20 comprising a main PCB 21 (Print Circuit Board) which has a DC-AC inversion circuitry 211 implemented thereon to convert an input DC signal into an output AC signal and is supported on a bottom wall of the inverter housing 10 within the receiving compartment 11, wherein a portion of the main PCB 21 is located at the interference zone of the inverter housing 10, and a portion of the main PCB 21 is located at the free zone of the inverter housing 10.

The interference insulating arrangement 30 comprises a DC inlet 31 electrically connected to the main PCB 21 for connecting with a DC power source to draw a DC current as the input DC signal to the main PCB 21, wherein the DC inlet 31 is located at the free zone of the receiving compartment 11 to insulate the DC inlet 31 from being electromagnetically interfered during a DC to AC conversion at the power conversion module 20.

Moreover, the inference insulating arrangement 30 further comprises a insulating member 32 disposed between the bottom wall of the inverter housing 10 and the main PCB 21 to insulate the DC inlet 31 with the bottom wall of the inverter housing 10 so as to further minimize the electromagnetic interference of the DC inlet 11 with respect to the inverter housing 10.

Figure 2:
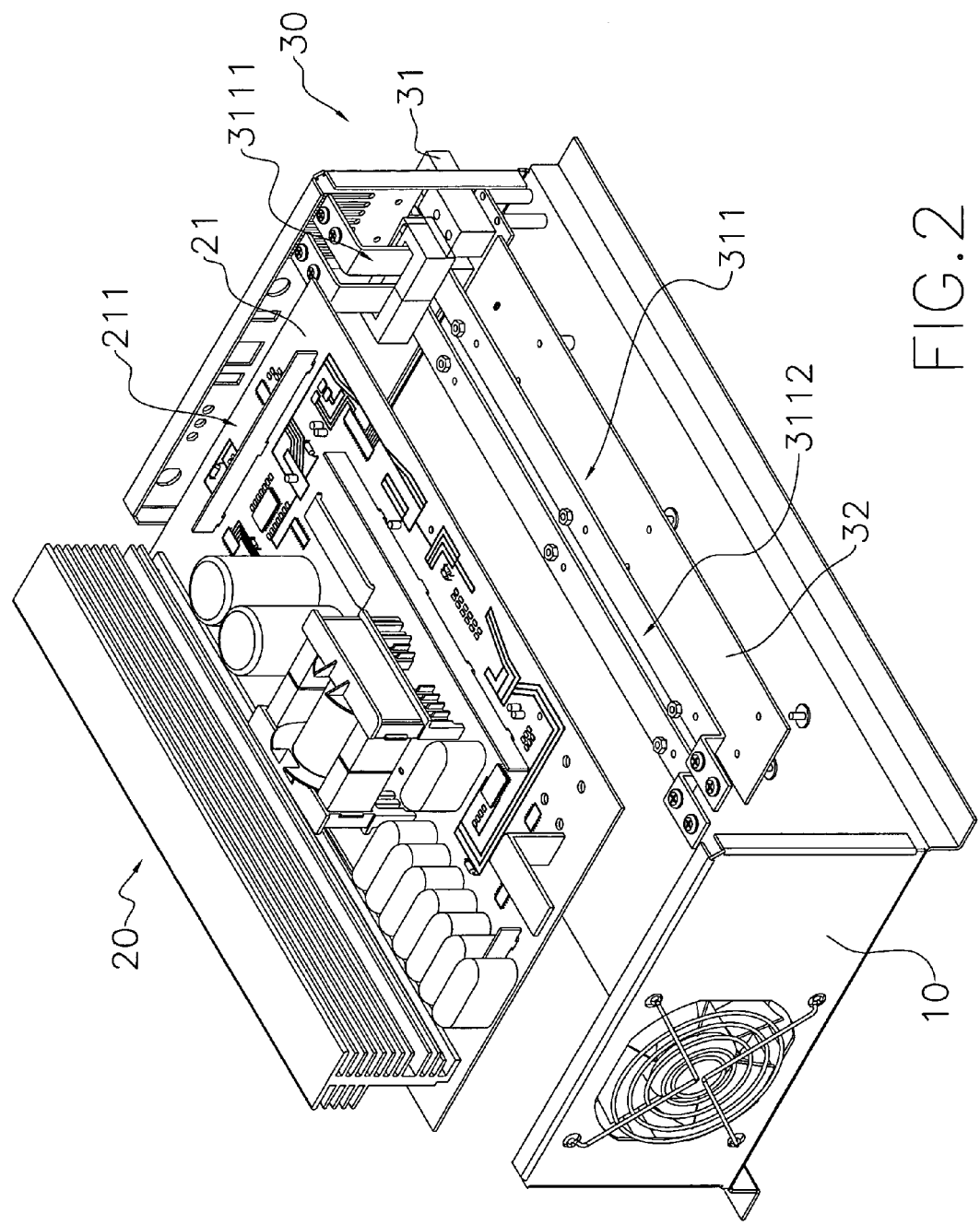
FIG. 2 is an exploded perspective view of the DC-AC inverter according to the above preferred embodiment of the present invention.

Referring to FIG. 1 and FIG. 2 of the drawings, the interference zone is characterized as affected by electromagnetic field which is primarily responsible for affecting with the AC-DC conversion by the power conversion module 20, while the free zone is characterized as being insignificantly interfered by electromagnetic field so that electrical current passing through the free zone is capable of being efficiently and effectively converted/inverted.

Thus, the interference zone is expected to be in a front portion of the inverter housing 10 where external DC power source is usually situated nearby for supplying DC to the DC-AC inverter of the present invention. As such, the interference zone is expected to subject to severe electromagnetic interference from the external DC power source.

Conversely, the free zone is expected to be in a rear portion of the inverter housing 10 where the external DC power source is situated at a distance and, as a result, it is expected to be free of significant electromagnetic interference.

According to the preferred embodiment, the DC inlet 31 comprises a plurality of conductive members 311 electrically connected with the main PCB 21 and the DC-AC inversion circuitry 211 and extended out of the inverter housing 10 for connecting with the external DC power source. According to the preferred embodiment, the DC inlet 31 are mounted on the free zone in the inverter housing in such a manner that when the DC power source supplies a predetermined amount of electric current to the DC inlet 31, the electric current is free from electromagnetically interfered so as to ensure optimal quality of DC-AC conversion at the power conversion module 20.

Specifically, the conductive members 311 are preferably made of copper or aluminum having optimal conductivity for transmitting the direct current into the main PCB 21 and the DC-AC inversion circuitry 211. As shown in FIG. 2 of the drawings, each of the conductive members 311 is elongated in shape and longitudinally extended along the free zone of the inverter housing 10 for electrically connecting between different terminals of the DC-AC inversion circuitry 211 as printed on the main PCB 21. In other words, each of the conductive members 311 an end inlet portion 3111 mounted at a rear right side of the inverter housing 11 for connecting with the external DC power source and an elongated body portion 3112 longitudinally extended along the free zone to electrically connect with the main PCB 21.

According to the preferred embodiment of the present invention, each of the end inlet portions 3111 has a L-shaped cross section wherein the elongated body portion 3112 is extended within the free zone underneath the end inlet portion 3111 close to the bottom wall of the inverter housing 10 such that electromagnetic field generated by current passage through the elongated body portion 3112 can be minimized.

The insulating member 32 is sandwiched between the conductive members 311 and the bottom wall of the inverter housing 10 within the free zone in such a manner that electromagnetic interference from the inverter housing 10 is prevented from affecting electric current transmitted in the conductive members 311 so as to further insulate the DC inlet 31 from being electromagnetically interfered during a DC to AC conversion at the power conversion module 20.

As a result, the electromagnetic field due to current passage through the elongated body portion 3112 is well insulated and, as a result, is kept to the minimum or insignificant.

Preferably, the insulating member 32 is embodied as being made of silicon rubber which is capable of insulating electricity and absorbing a large amount of heat so as to assist the DC-AC inverter from extracting heat during the DC-AC conversion process. This feature is of considerable importance because when the temperature within the DV-AC inverter is allowed to raise uncontrollably, the resistance, which is proportional to the respective temperature, of the conductive members 311 will increase to substantially affect the DC-AC conversion effectiveness and efficiency. In particular, as resistance increases, for the same current, the voltage will decrease and energy is thereby lost through further increase in temperature of the DC inlet 31.

However, it is important to point out that a wide variety of different materials may also be utilized to manufacture the insulating member 32 as well. They are: insulating PCB, wooden plate, polyester film, or glass fibered reinforced matrix composite materials. Among these materials, insulating PCB may be utilized to incorporate with capacitor circuitry for filtering any electromagnetic noise present in the conductive members 311.

In order to further enhance inventive features of the present inventions, the insulating arrangement 30 further comprises a plurality of capacitating devices electrically communicated with the DC inlet 31 for filtering electromagnetic noise. Preferably, the capacitating devices are electrically mounted on the conductive members 311 for absorbing and filtering electromagnetic noise which is somehow present in the DC inlet.

It is worth mentioning at this point that the capacitating devices can be efficiently utilized with the insulating member 32 which is made by the above-mentioned materials expect the insulating PCB. In such a case, the insulating PCB may incorporate with a capacitor circuitry to perform the same function as the capacitating devices. Of course, where the insulating PCB is utilized, the capacitating devices may nevertheless be used to enhance the electromagnetic noise filtering. Alternatively, it may be that the insulating PCB is solely used without the capacity circuitry. In such a case, the capacitating devices 33 can be utilized in the similar fashion as just mentioned above.

Furthermore, the insulating arrangement 30 further comprises a plurality of induction devices provided on the end inlet portion 3111 of each of the conductive members 311 and electrically communicated with the respective capacitating device 33 so as to form an L-C circuit for each of the conductive members 311, wherein the L-C circuit is adapted to assist in optimizing electromagnetic noise filtering of the DC inlet 31.

It is worth mentioning that according to one example of a design specification of the present invention, the DC-AC inverter is fitted for being used in an environment characterized by:

Power: 1000 W;
Voltage: 12V;
Electric current: 100 A–200 A; and
Temperature: 60°–70°

From the forgoing descriptions, it can be seen that the above-mentioned objects have been substantially achieved. The present invention provides an economical yet effective DC-AC inverter the performance of which is minimally affected by electromagnetic interference which is inherent in various power electronics within and in the vicinity of a conventional DC-AC inverter.

Of course, it is worth mentioning that the above example is characterized by a power of 1000 W, voltage of 12V, electric current 100 A–200 A, and temperature 60°–70° to illustrate the preferred embodiment of the invention. It is intended to be limiting and the DC-AC inverter is fitted for being used for other parameters as well.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. An DC-AC inverter, comprising:
an inverter housing having a receiving compartment and defining an interference zone within which electromagnetic interference occurs, and a free zone free of electromagnetic interference;
a power conversion module comprising a main PCB (Print Circuit Board) which has a DC-AC inversion circuitry implemented thereon to convert an input DC signal into an output AC signal and is supported on a bottom wall of said inverter housing within said receiving compartment, wherein a portion of said main PCB is located at said interference zone of said inverter housing and a portion of said main PCB is located at said free zone of said inverter housing; and
an interference insulating arrangement, comprising:
a DC inlet electrically connected to said main PCB for connecting with a DC power source to draw of a DC current as said input DC signal to said main PCB, wherein said CD inlet is located at said free zone of said receiving compartment to insulate said DC inlet from being electromagnetically interfered during a DC to AC conversion at said power conversion module; and
an insulating member disposed between said bottom wall of said inverter housing and said main PCB to insulate said DC inlet with said bottom wall of said inverter housing so as to further minimize said electromagnetic interference of said DC inlet with respect to said inverter housing.

2. The DC-AC inverter, as recited in claim 1, wherein said DC inlet comprises a plurality of conductive members electrically connected with said main PCB and said DC-AC inversion circuitry, wherein said conductive members are supported on a rear portion of said inverter housing for connecting with said DC power source, and extended within said free zone in said inverter housing along said bottom wall thereof for minimizing electromagnetic interference.

3. The DC-AC inverter, as recited in claim 2, wherein each of said conductive members has an end inlet portion mounted at a rear right side of said inverter housing for connecting with said DC power source, and an elongated body portion longitudinally extended along said free zone to electrically connect with said main PCB without being electromagnetically interfered.

4. The DC-AC inverter, as recited in claim 2, wherein each of said end inlet portions has a L-shaped cross section wherein said elongated body portion is downwardly extended from said end inlet portion to extended along said free zone underneath said end inlet portion near said bottom wall of said inverter housing such that electromagnetic field generated by current passage through said elongated body portion is kept to minimum.

5. The DC-AC inverter, as recited in claim 3, wherein each of said end inlet portions has a L-shaped cross section wherein said elongated body portion is downwardly extended from said end inlet portion to extended along said free zone underneath said end inlet portion near said bottom wall of said inverter housing such that electromagnetic field generated by current passage through said elongated body portion is kept to minimum.

6. The DC-AC inverter, as recited in claim 3, wherein said insulating member is embodied as a heat sink which is adapted to extract heat from said receiving compartment of said inverter housing so as to regulate a temperature of said DC inlet in such a manner to prevent said DC inlet from being heated up to increase a resistance thereof which causes a voltage drop along said DC inlet so as to prevent considerable energy loss from said DC-AC inverter.

7. The DC-AC inverter, as recited in claim 4, wherein said insulating member is embodied as a heat sink which is adapted to extract heat from said receiving compartment of said inverter housing so as to regulate a temperature of said DC inlet in such a manner to prevent said DC inlet from being heated up to increase a resistance thereof which causes a voltage drop along said DC inlet so as to prevent considerable energy loss from said DC-AC inverter.

8. The DC-AC inverter, as recited in claim 5, wherein said insulating member is embodied as a heat sink which is adapted to extract heat from said receiving compartment of said inverter housing so as to regulate a temperature of said DC inlet in such a manner to prevent said DC inlet from being heated up to increase a resistance thereof which causes a voltage drop along said DC inlet so as to prevent considerable energy loss from said DC-AC inverter.

9. The DC-AC inverter, as recited in claim 6, wherein said insulating arrangement further comprises a plurality of capacitating devices electrically communicated with said DC inlet for filtering electromagnetic noise formed therein.

10. The DC-AC inverter, as recited in claim 7, wherein said insulating arrangement further comprises a plurality of capacitating devices electrically communicated with said DC inlet for filtering electromagnetic noise formed therein.

11. The DC-AC inverter, as recited in claim 8, wherein said insulating arrangement further comprises a plurality of capacitating devices electrically communicated with said DC inlet for filtering electromagnetic noise formed therein.

12. The DC-AC inverter, as recited in claim 9, wherein said insulating arrangement further comprises a plurality of induction devices wound on said end inlet portion of each of said conductive members, and electrically communicated with said respective capacitating device to form an L-C circuit for each of said conductive members, wherein said L-C circuit is adapted to assist in optimizing electromagnetic noise filtering of said DC inlet.

13. The DC-AC inverter, as recited in claim 10, wherein said insulating arrangement further comprises a plurality of induction devices wound on said end inlet portion of each of said conductive members, and electrically communicated with said respective capacitating device to form an L-C circuit for each of said conductive members, wherein said L-C circuit is adapted to assist in optimizing electromagnetic noise filtering of said DC inlet.

14. The DC-AC inverter, as recited in claim 11, wherein said insulating arrangement further comprises a plurality of induction devices wound on said end inlet portion of each of said conductive members, and electrically communicated with said respective capacitating device to form an L-C circuit for each of said conductive members, wherein said L-C circuit is adapted to assist in optimizing electromagnetic noise filtering of said DC inlet.

15. The DC-AC inverter, as recited in claim 1, wherein said interference zone is formed at a front portion of said inverter housing, where said DC power source is situated nearby for supplying DC said DC-AC inverter, while said free zone is formed at a rear portion of said inverter housing where said DC power source is situated at a distance, so that said free zone is adapted for being free of significant electromagnetic interference.

16. The DC-AC inverter, as recited in claim 2, wherein said interference zone is formed at a front portion of said inverter housing, where said DC power source is situated nearby for supplying DC said DC-AC inverter, while said free zone is formed at a rear portion of said inverter housing where said DC power source is situated at a distance, so that said free zone is adapted for being free of significant electromagnetic interference.

17. The DC-AC inverter, as recited in claim 12, wherein said interference zone is formed at a front portion of said inverter housing, where said DC power source is situated nearby for supplying DC said DC-AC inverter, while said free zone is formed at a rear portion of said inverter housing where said DC power source is situated at a distance, so that said free zone is adapted for being free of significant electromagnetic interference.

18. The DC-AC inverter, as recited in claim 13, wherein said interference zone is formed at a front portion of said inverter housing, where said DC power source is situated nearby for supplying DC said DC-AC inverter, while said free zone is formed at a rear portion of said inverter housing where said DC power source is situated at a distance, so that said free zone is adapted for being free of significant electromagnetic interference.

19. The DC-AC inverter, as recited in claim 17, wherein said insulating member is manufactured by one of insulating PCB, wood, polyester film, glass fibered reinforced matrix composite, and aluminum substrate.

20. The DC-AC inverter, as recited in claim 18, wherein said insulating member is manufactured by one of insulating PCB, wood, polyester film, glass fibered reinforced matrix composite, and aluminum substrate.

* * * * *